United States Patent
Sato et al.

(10) Patent No.: US 8,148,268 B2
(45) Date of Patent: Apr. 3, 2012

(54) PLASMA TREATMENT APPARATUS AND PLASMA TREATMENT METHOD

(75) Inventors: Kohei Sato, Kudamatsu (JP); Hideaki Kondo, Kudamatsu (JP); Susumu Tauchi, Shunan (JP); Akitaka Makino, Hikari (JP)

(73) Assignee: Hitachi High-Technologies Corporation, Tokyo (JP)

( * ) Notice: Subject to any disclaimer, the term of this patent is extended or adjusted under 35 U.S.C. 154(b) by 1040 days.

(21) Appl. No.: 12/040,011

(22) Filed: Feb. 29, 2008

(65) Prior Publication Data

US 2009/0152242 A1 Jun. 18, 2009

(30) Foreign Application Priority Data

Dec. 17, 2007 (JP) ................. 2007-324160

(51) Int. Cl.
*H01L 21/302* (2006.01)
*H01L 21/461* (2006.01)
(52) U.S. Cl. ......... 438/706; 438/710; 438/711; 438/714
(58) Field of Classification Search .................. None
See application file for complete search history.

(56) References Cited

U.S. PATENT DOCUMENTS

2007/0287297 A1* 12/2007 Kikuchi et al. ............... 438/719

FOREIGN PATENT DOCUMENTS

JP 07-306084 11/1995

* cited by examiner

*Primary Examiner* — Duy Deo
(74) *Attorney, Agent, or Firm* — Antonelli, Terry, Stout & Kraus, LLP.

(57) ABSTRACT

The invention provides a plasma treatment apparatus or a plasma treatment method having a high productivity while maintaining a stable treatment performance. In a plasma treatment apparatus feeding a plurality of gases fed into the treatment chamber and treating a sample arranged within the treatment chamber by a plasma formed by using the plurality of gases, the plasma treatment apparatus has a plurality of feeding gas lines in which the plurality of gases respectively pass, a plurality of gas flow rate regulators respectively arranged on the feeding gas lines and respectively regulating flow rates of the plurality of gases, and a testing gas flow path coupled to the gas line so as to be arranged outside the treatment chamber and arranging a tester testing a flow rate of a gas from a gas flow rate controller therein, and the plasma treatment apparatus tests the gas flow rate regulator on a gas line corresponding to the gas which is not used for the treatment in the plurality of gases in parallel with the treatment.

5 Claims, 5 Drawing Sheets

PLASMA TREATMENT APPARATUS AND PLASMA TREATMENT METHOD

BACKGROUND OF THE INVENTION (1) Field of the Invention

The present invention relates to a plasma treatment apparatus or a plasma treatment method for treating by arranging a sample corresponding to a substrate-shaped treated subject such as a semiconductor wafer or the like in an inner portion of a treatment chamber within an evacuated vacuum vessel and using a plasma formed in the inner portion of the treatment vessel, and more particularly to a plasma treatment apparatus or a plasma treatment method provided with a flow rate regulator regulating a flow rate and a speed of a treating gas introduced to the inner portion of the treatment chamber for forming the plasma.

(2) Description of Related Art

In the plasma treatment apparatus mentioned above, one kind of gas or a mixture (a treating gas) obtained by mixing plural kinds of material gases so as to be better adapted to a treatment of a sample is introduced into a treatment chamber which is arranged in an inner portion of a vacuum vessel depressed by a vacuum pump and corresponds to a space in which a plasma is formed, and is formed as a plasma by an electric field or a magnetic field feeding the gas, and a treatment such as an etching or the like is applied to the sample by using the plasma. The treating gas used for the treatment mentioned above is fed through a feed path constructed by a metal pipe coupled to a gas source such as a tank or the like, and a flow rate and a speed thereof are regulated by a gas flow rate regulator arranged on the feed path, whereby the gas is introduced into the treatment chamber in which the sample is arranged.

Since the flow rate and the speed of the treating gas introduced to the treatment chamber greatly affect a performance of the treatment, it is necessary to maintain the regulation by the gas flow rate regulator for stably carrying out the treatment. However, in the gas flow rate regulator, there is a case that a precision of its regulation is deteriorated with time due to a drift of a characteristic of a sensor in an inner portion, a clogging of the gas flow path and the like going with an elapse of time and an increase of a number of the treated samples.

For example, a mass flow controller generally used as the flow rate regulator of the treating gas of the plasma treatment apparatus is provided with a structure which can achieve a flow rate suitable for a corresponding treatment condition or can correspond to a change of a recipe of the treatment by desirably changing a cross sectional area of the flow path arranged on the flow path of the gas in the inner portion thereof so as to change a flow rate. The mass flow controller aims to control a small flow rate suitable for the treatment using the plasma, accordingly has a narrow tubular gas flow path in an inner portion thereof, and accurately changes a cross sectional area of the flow path in correspondence to an applied electric power to an area of a small flow path such as a diaphragm or the like.

A material used for the etching treatment as the treating gas flowing through the mass flow controller mentioned above includes a material having a possibility of precipitating a solid material even within the flow path in the inner portion. In this case, the cross sectional area of the flow path or the piping of the feed path is changed by the precipitated material, so that an expected flow rate change can not be achieved even if the change of the flow path is generated by a predetermined deformation of the diaphragm. In other words, if the change mentioned above is generated, a relation between an applied voltage in the mass flow controller and an actual flow rate is changed, and the actual flow rate is changed even in the case that the setting of the applied voltage is not changed. Accordingly, a stability of a process is deteriorated.

Accordingly, in conventional, the actual flow rate of the mass flow controller is measured so as to carry out a test for resetting the relation between the applied power (the change of the cross sectional area of the flow path) and the flow rate so as to flow an initial gas flow rate, periodically, after treating a predetermined number of samples or in the case that the change mentioned above is determined to be generated. In other words, there is carried out an operation for testing whether or not the flow rate controlled by the gas flow rate regulator achieves the previously set flow rate so as to adjust the relation between the motion of the gas flow rate regulator and the flow rate as occasion demands so that the regulator can show a precise or desired value, so-called the test of the gas flow rate regulator. As an example of the art mentioned above, there has been known a structure disclosed in JP-A-7-306084.

SUMMARY OF THE INVENTION

However, the prior art does not sufficiently take the following problem into consideration. In other words, since it is generally hard to measure the actual flow rate of the mass flow controller in a state of being attached onto the feed path coupled to the treatment chamber from the gas source of the treating gas, the user must check the function of the mass flow rate controller while the samples in the treatment chamber is not treated. In the prior art mentioned above, a time necessary for the test is long and a non-operating time of the plasma treatment apparatus becomes long, thereby deteriorating an efficiency of the treatment.

On the other hand, there has been known a structure which is arranged so as to be coupled to a feed path for a treating gas between the mass flow controller and the treatment chamber, is provided with a measuring gas line for measuring the actual flow rate of the treating gas, switches the gas feed to the measuring gas line at a time of testing the mass flow controller, and measures the flow rate so as to test while feeding the treating gas onto the measuring gas line, such as is disclosed in the patent publication.

However, in recent years, in order to achieve a high precision and a high efficiency of the treatment by the plasma, a kind of the gas of the material fed into the treatment chamber as the treating gas is increased. Particularly, in the apparatus continuously carrying out a plurality of treatment steps comprising a plurality of different treatment conditions without carrying the sample out of the treatment chamber, the number of the gas of the used material is some to ten and some or more with respect to one treatment chamber, and the number of the material tends to be increased in accordance with an increase of the steps of the continuously carried out steps. In order to regulate the flow rate of the treating gas so as to feed, it is necessary to provide at least the same number of gas flow rate regulators as the number of the materials of the gas.

Further, the test of the gas flow rate regulator is carried out with respect to all the installed gas flow rate regulators. Further, in the case that the test is carried out with respect to a plurality of flow rates of each of the gas flow rate regulators, some tens minutes to some hours are necessary for the test. Since the treatment chamber carrying out the test during the test time can not carry out the treatment of the sample and is set to a non-operation state, the prior art mentioned above does not take into consideration a point that the non-operating time is increased in accordance with an increase of the time necessary for the test mentioned above so as to lower the efficiency of the treatment.

An object of the present invention is to provide a plasma treatment apparatus or a plasma treatment method having a high productivity while maintaining a stable treatment performance by carrying out a test of a gas flow rate regulator.

The object mentioned above can be achieved by the following plasma treatment apparatus. In other words, in accordance with the present invention, there is provided a plasma treatment apparatus comprising:

a treatment chamber arranged within a vacuum vessel;

an exhaust device exhausting an inner portion of the treatment chamber so as to depressurize to a predetermined pressure; and the plasma treatment apparatus feeding a plurality of gases fed into the treatment chamber and treating a sample arranged within the treatment chamber by a plasma formed by using the plurality of gases, wherein the plasma treatment apparatus comprises:

a plurality of feeding gas lines communicated with an inner side of the treatment chamber and respectively passing the plurality of gases therethrough;

a plurality of gas flow rate regulators respectively arranged on the feeding gas lines and respectively regulating flow rates of the plurality of gases; and a testing gas flow path coupled to the gas line so as to be arranged outside the treatment chamber and arranging a tester testing a flow rate of a gas from a gas flow rate controller therein, and wherein the plasma treatment apparatus tests the gas flow rate regulator on a gas line corresponding to the gas which is not used for the treatment in the plurality of gases in parallel with the treatment.

Alternatively, there is provided a plasma treatment apparatus comprising:

a treatment chamber arranged within a vacuum vessel;

an exhaust apparatus exhausting an inner portion of the treatment chamber so as to depressurize to a predetermined pressure; and the plasma treatment apparatus feeding a plurality of gases fed into the treatment chamber and treating a sample arranged within the treatment chamber by a plasma formed by using the plurality of gases, wherein the plasma treatment apparatus comprises:

a vacuum carrier chamber coupled to the vacuum vessel and structured such that an inner portion is communicated with an inner side of the treatment chamber and the sample is carried in the inner portion thereof;

a plurality of feeding gas lines communicated with an inner side of the treatment chamber and respectively passing the plurality of gases therethrough;

a plurality of gas flow rate regulators respectively arranged on the feeding gas lines and respectively regulating flow rates of the plurality of gases; and a testing gas flow path coupled to the gas line so as to be arranged outside the treatment chamber and arranging a tester testing a flow rate of a gas from a gas flow rate controller therein, and wherein the plasma treatment apparatus tests the gas flow rate regulator on a gas line corresponding to the gas which is not used for the treatment in the plurality of gases in parallel with the sample carrier.

Alternatively, there is provided a plasma treatment method comprising the steps of:

arranging a sample to be treated within a treatment chamber arranged within a vacuum vessel and depressurized;

communicating a plurality of gases fed into the treatment chamber with the inner side of the treatment chamber so as to respectively regulate and feed flow rates of the plurality of gases by a plurality of gas flow rate regulators arranged on a plurality of feeding gas lines through which the plurality of gases respectively pass through; and treating the sample arranged within the treatment chamber by a plasma formed by using the plurality of gases, wherein the gas lines has a testing gas flow path coupled thereto so as to be arranged out of the treatment chamber and arranging a tester testing a gas flow rate from the gas flow rate controller therein, thereby testing the gas flow rate regulator on the gas line corresponding to the gas which is not used for the treatment in the plurality of gases in parallel with the treatment.

Alternatively, there is provided a plasma treatment method comprising the steps of:

arranging a sample to be treated within a treatment chamber arranged within a vacuum vessel and depressurized;

communicating a plurality of gases fed into the treatment chamber with the inner side of the treatment chamber so as to respectively regulate and feed flow rates of the plurality of gases by a plurality of gas flow rate regulators arranged on a plurality of feeding gas lines through which the plurality of gases respectively pass through; and treating the sample arranged within the treatment chamber by a plasma formed by using the plurality of gases, wherein the gas lines has a testing gas flow path coupled thereto so as to be arranged out of the treatment chamber and arranging a tester testing a gas flow rate from the gas flow rate controller therein, and wherein the method comprises a step of carrying the sample in an inner portion of a vacuum carrier chamfer coupled to the treatment chamber and the vacuum vessel and communicated with the inner side of the treatment chamber in an inner portion; and a step of testing the gas flow rate regulator on the gas line corresponding to the gas which is not used for the carrier in the plurality of gases in parallel with the sample carrier.

Further, the test of the gas flow rate regulator is carried out by the tester on the testing gas line to which the gas line of an exclusively selected specific gas in the plurality of gases is coupled.

Further, the plurality of gas feeding gas lines are divided into a plurality of groups, and the test of the gas line in the other group is carried out in parallel to the gas feed to the treatment chamber by one group.

Other objects, features and advantages of the invention will become apparent from the following description of the embodiments of the invention taken in conjunction with the accompanying drawings.

DETAILED DESCRIPTION OF THE INVENTION

A description will be given of an embodiment in accordance with the present invention with reference to the accompanying drawings.

Embodiment 1

A description will be given of a first embodiment in accordance with the present invention with reference to FIGS. 1 to 3.

Figure 1A:
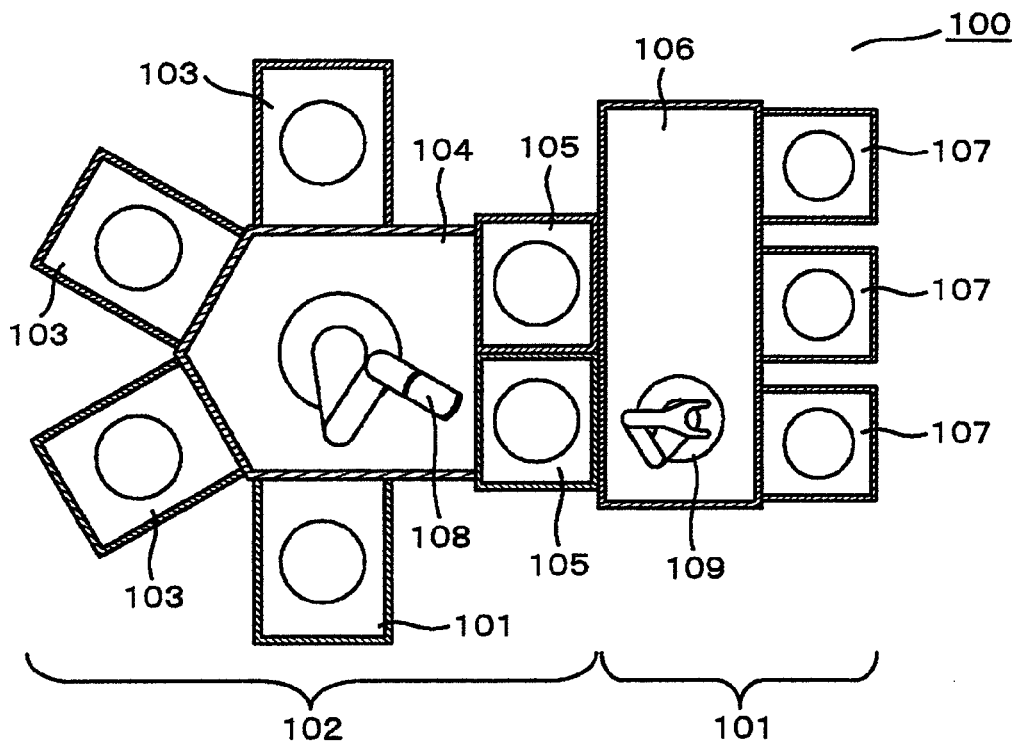
FIGS. 1A and 1B are views schematically showing an outline of a whole structure of a plasma treatment apparatus in accordance with a first embodiment of the present invention.
Figure 1B:
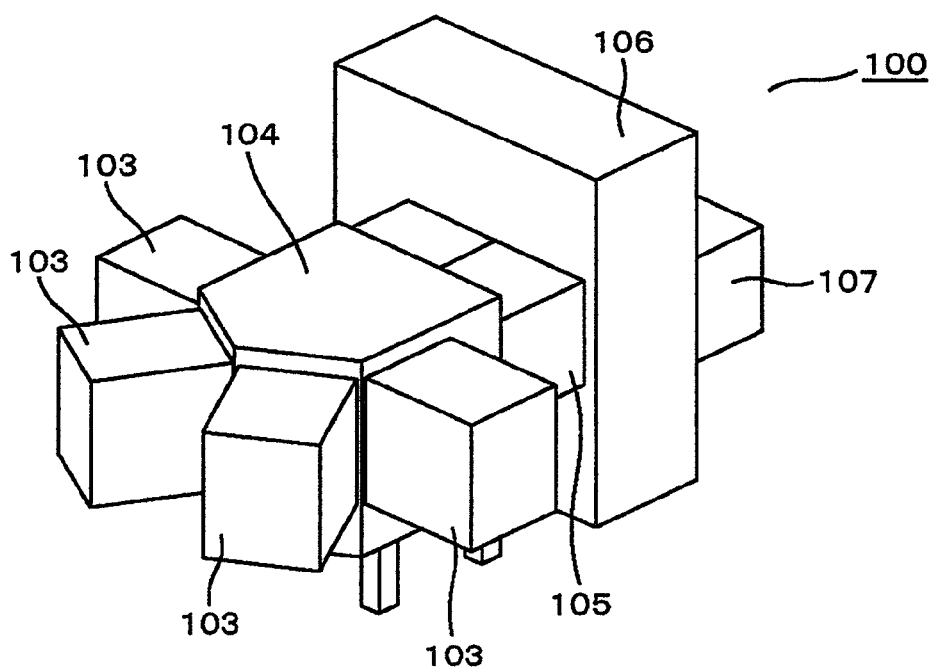

FIGS. 1A and 1B are views schematically showing an outline of a whole structure of a plasma treatment apparatus in accordance with the first embodiment of the present invention. FIG. 1A is a horizontal cross sectional view showing an outline of a structure in the case of viewing the plasma treatment apparatus from an upper side. FIG. 1B is a perspective view of the plasma treatment apparatus.

A plasma treatment apparatus 100 in accordance with the present embodiment shown in FIGS. 1A and 1B is broadly provided with an atmospheric air side block 101 and a vacuum side block 102. The atmospheric air side block 101 is a portion which carries, stores and positions a wafer under an atmospheric pressure, and the vacuum side block 102 is a block which carries a substrate-shaped sample such as the wafer or the like under a pressure depressurized from the atmospheric pressure and carries out a treatment within a predetermined treatment vessel. There is further provided with a portion which changes the pressure up and down between the atmospheric pressure and the vacuum pressure in a state of having the sample in an inner portion, between a position carrying out the carrier and the treatment and the atmospheric air side block 101.

The atmospheric air side block 101 has an approximately rectangular parallelepiped casing 106 provided with an atmospheric air side carrier robot 109 in an inner portion, and is provided with a plurality of cassette tables 107 attached to a front surface side (a right side of the drawing) of the casing 106 and mounting a cassette in which the treating or cleaning sample is stores thereon.

The vacuum side block 102 is provided with four treatment vessels 103 each having a vacuum vessel including a treatment chamber structured such that an inner portion is depressurized and a sample is carried to the inner portion so as to be treated, and two lock chambers 105 arranged between a vacuum carrier chamber 104 and the atmospheric air side block 101 and exchanging the sample between the atmospheric air side and the vacuum side, around a side wall surface of the vacuum carrier chamber 104 in which a plane shape is approximately a polygonal shape (a pentagonal shape in the present embodiment). The vacuum side block 102 is a treatment vessel which can be maintained at a pressure having a high degree of vacuum by being depressurized.

A vacuum carrier robot 108 carrying the sample between the lock chamber 105 and the treatment chamber within the treatment vessel 103 under the vacuum is arranged in the center of the carrier chamber within the vacuum carrier chamber 104. The sample is mounted on an arm of the vacuum carrier robot 108, and a carry-in and carry-out are carried out between a sample table arranged within the treatment chamber of each of the treatment vessels 103 and a sample table within any one of the lock chambers 105. A communicating passage is opened and closed between the treatment vessel 103, and the carrier chamber within the lock chamber 105 and the vacuum carrier chamber 104 by a valve which can be closed and opened in an airtight manner.

A plurality of samples such as semiconductor wafers stored within a cassette mounted on any one of the cassette tables 107 are determined by a control apparatus regulating a motion of the vacuum treatment apparatus 100 (not shown) or are given a command from a control apparatus of a manufacturing line in which the vacuum treatment apparatus 100 is installed, whereby a treatment thereof is started. The atmospheric air side carrier robot 109 receiving the command from the control apparatus takes out the specific sample within the cassette from the cassette, and carries to any one of two lock chambers.

In the lock chamber 105, a valve is closed and sealed in a state of storing the carried sample, and the lock chamber 105 is depressurized to a predetermined pressure. Thereafter, the valve in a side facing to the carrier chamber within the vacuum carrier chamber 104 is opened so as to communicate the inner side of the lock chamber 105 with the inner side of the carrier chamber, and an arm of the vacuum carrier robot 108 is elongated into the lock chamber 105 so as to carry out the sample in the inner portion. The sample mounted to the arm on the vacuum carrier robot 108 is carried in the inner side of the evacuated treatment chamber in any one of the predetermined treatment vessels 103 at a time of being taken out of the cassette.

After the sample is carried to the treatment chamber within the any treatment vessel 103, the valve opening and closing between the inner side of the treatment vessel and the carrier chamber is closed and the treatment chamber is sealed. Thereafter, the treating gas is introduced into the treatment chamber, the plasma is formed within the treatment chamber, and the sample is treated.

If the end of the sample treatment is detected, the valve is opened, and the sample is carried out toward the lock chamber 105 inversely to the case of being carried in the treatment chamber, by the vacuum carrier robot 108. If the sample is carried in any one of the lock chambers 105, the valve opening and closing the passage communicating the inner side of the lock chamber 105 with the carrier chamber is closed, the inner portion is sealed, and the pressure within the lock chamber 105 is increased to the atmospheric pressure.

Thereafter, the valve in the inner side of the casing 106 is opened so as to communicate the inner side of the lock chamber 105 with the atmospheric air carrier chamber within the casing 106, and the sample is carried to the original cassette from the lock chamber 105 by the atmospheric air side carrier robot 109 so as to be returned to the original position within the cassette.

Figure 2:
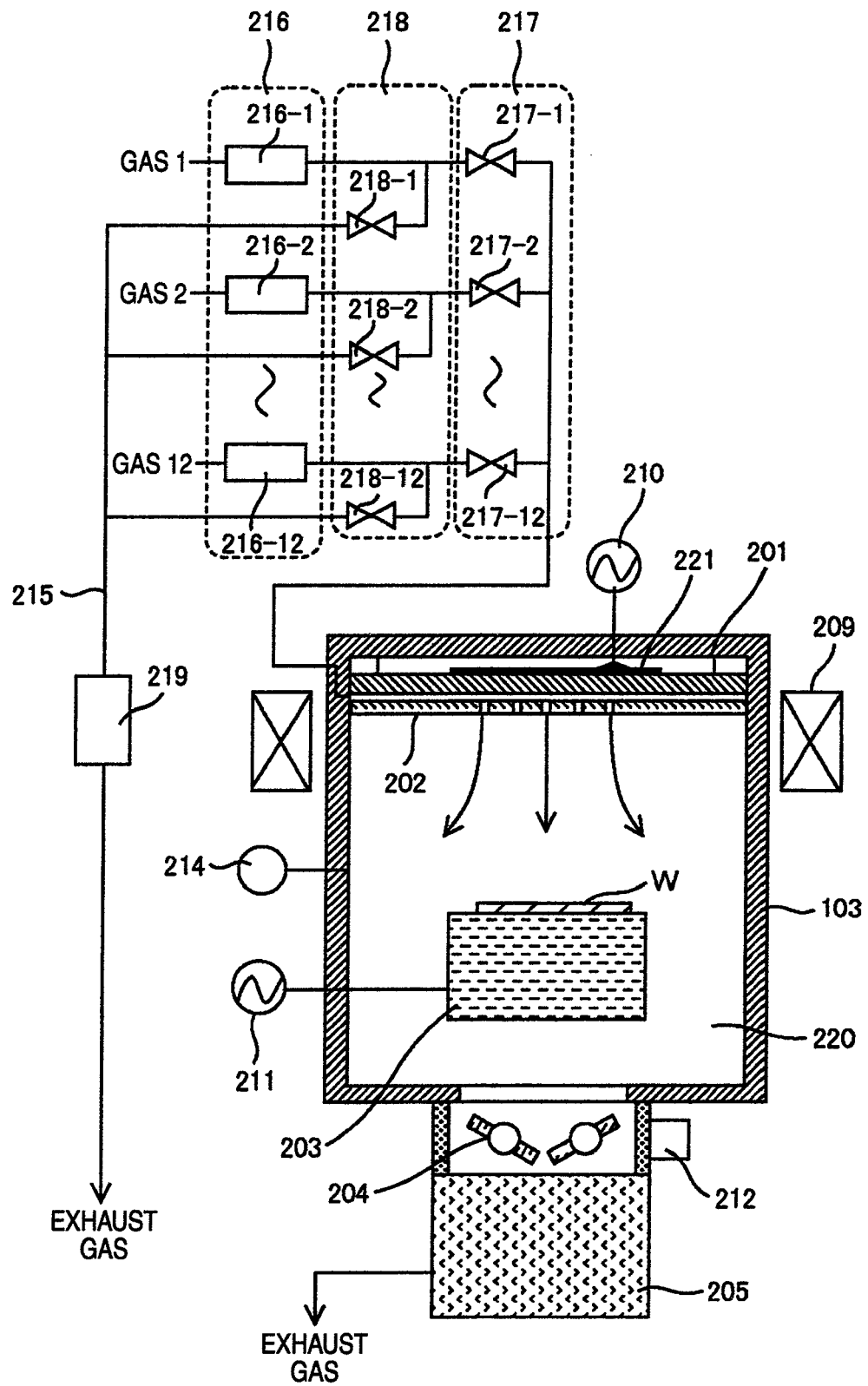
FIG. 2 is a vertical cross sectional view schematically showing an outline of a structure of a treatment vessel 103 of the embodiment shown in FIGS. 1A and 1B.

FIG. 2 is a vertical cross sectional view schematically showing an outline of the structure of the treatment vessel 103 of the embodiment shown in FIGS. 1A and 1B. In this drawing, the treatment vessel 103 is structured such as to be provided with a vacuum vessel 201, a radio source 210 arranged in an upper portion of the vacuum vessel 201 and generating a UHF band or VHF band electric field and a vacuum exhaust pump 205 corresponding to an exhaust apparatus arranged in a lower side of the vacuum vessel, and a treatment chamber 220 is arranged in an inner portion of the vacuum vessel 201. A conductance variable valve 204 is arranged between the vacuum vessel 201 and the vacuum exhaust pump 205. These constituting parts are connected in an airtight manner by a seal means such as an O-ring (not shown) or the like and are structured such as to be capable of maintaining an inside space and an outward space at a high air pressure difference. A sample W is loaded on a sample table 203 arranged in the inner portion of the evacuated treatment chamber 220 and is treated.

The treatment chamber 220 in accordance with the present embodiment is structured such that an inner side wall is provided substantially with a cylindrical shape or substantially with a cylindrical shape obtained by coupling a plurality of cylindrical shapes, and the sample table 203 including an electrode to which a high-frequency power is supplied in an inner portion is also provided substantially with a cylindrical shape coaxially aligned with a center axis of the cylindrical shape of the treatment chamber 220. The conductance variable valve 204 positioned just below the sample table 203 below the treatment chamber 220 is arranged below an opening coaxially arranged in the same manner in a lower portion of the treatment chamber 220 and through which a gas and a reaction product within the treatment chamber 220 is exhausted, ad is rotated by a motor 212 so as to be actuated at an optional angle. A flow rate and a speed of the exhaust gas of the treatment chamber 220 from the opening are regulated by controlling an angle of the conductance variable valve 204. The pressure within the treatment chamber 220 is regulated to a predetermined pressure which is suitable for the treatment on the basis of a balance between the regulation of the exhaust gas and the gas feed from the upper portion of the treatment chamber 220, and is measured by a vacuum meter 214.

In the present embodiment, one of twelve kinds of material gases from a gas 1 to a gas 12 is used as the treating gas, or a mixed gas obtained by mixing plural kinds of material gases is used. The gas used for the treatment is regulated in a flow of a feed path constituted by pipings in which the gas 1 to the gas 12 respectively flow through inner portions, as follows.

At a time of the treatment, an apparatus control portion (not shown) arranged in a plasma treatment apparatus main body acquires a treatment information at a time of the treatment, and a single gas or a plurality of optional gases selected by the apparatus control portion in correspondence to a composition of the treating gas included in the information are accurately controlled by respective gas flow rate regulators 216-1 to 216-12 at set flow rates and speeds. They are mixed into one at a conflow portion of the supply path positioned in a back stream side of the gas flow rate regulators 216, and the mixture are introduced into the treatment chamber 220 through a further downstream side feed path.

The treating gas introduced to the upper portion of the treatment chamber 22 flows into a space provided in a lower side of a disc window made of a dielectric material in a lower side of a disc-shaped antenna 221 connected to the radio source 210, in an upper side of a gas diffusion plate 202 and stays in this space so as to be diffused, and is thereafter introduced to the upper portion of the treatment chamber 220 from a plurality of through holes arranged in the gas diffusion plate 202. The treating gas introduced to the inner portion of the treatment chamber 220 is excited by an electric field discharged from the antenna 221 on the basis of an electric power supplied to the antenna 221 from the radio source 210 and a high-frequency electromagnetic wave fed into the treatment chamber 220 from the solenoid coil 209, and the plasma is formed in the space above the sample W on the sample table 203 of the treatment chamber 220. Further, the sample table 203 is provided with an electrode constructed by a disc-shaped member made of a conductive material to which the electric power from a high-frequency bias power source 211 is fed, in an inner portion. Since a bias electric potential is formed on the surface of the sample W on the sample table and the above by the high-frequency electric power fed to the electrode, a high-frequency bias voltage is applied to the surface of the sample W on the basis of a relative electric potential difference with respect to the plasma, and the sample W is plasma treated chemically and physically by guiding an ion corresponding to a charged particle in the plasma on the basis of the electric potential difference so as to run into the surface of the sample W.

In the plasma treatment apparatus shown in the present embodiment, in order to treat one sample, an etching treatment is applied to the surface of the sample by using a plurality of treatment steps having different treatment conditions such as a pressure within the treatment chamber 220, a gas kind and a flow rate of the treating gas and the like. For example, in the case of using the gas in some step, the valve 217-1 is opened, the valve 218-1 is closed, and the gas controlled at a set flow rate by the gas flow rate regulator 216-1 is introduced. Further, in the case that the gas 2 is not used in this step, the valve 217-2 is kept in a closed state. In all the gases from the gas 1 to the gas 12, the corresponding valve in the valves 217-1 to 217-12 is opened and the corresponding valve in the valves 218-1 to 218-12 is closed with respect to the gas which is used for the plasma treatment in the step, and the corresponding valve in the valves 217-1 to 217-12 is set to the closed state with respect to the gas which is not used for the plasma treatment.

In the present embodiment, the gas line coupled to the end portion in the downstream side of the valves 218-1 to 218-12 is exhausted by a vacuum exhaust pump (not shown). Hereinafter, the gas line corresponding to an exhaust path coupled to the valves 218-1 to 218-12 in the downstream side thereof and exhausting the gas flowing through the inner portion is called as a gas exhaust line 215. In the gas exhaust line 215, one gas flow rate meter 219 is arranged on a path in which the pipings coupled to the downstream side end portions of the valves 218-1 to 218-12 conflow into one in the downstream side, and the gas in the inner portion of the gas line in which any one of the valves 218-1 to 218-12 is opened is exhausted via the gas flow rate meter 219. In other words, each of the gas lines for feeding is structured such as to be capable of being exclusively coupled to the gas exhaust line 215, and only the regulator of the gas line for feeding the specific material gas of the gas flow rate regulator 216 is connected to the gas exhaust line 215 so as to be capable of exhausting the gas.

In this case, it is possible to check out whether or not the flow rate of the gas regulated by the gas flow rate regulator 216 is regulated to a desired flow rate by measuring the gas flow rate regulated to a flow rate set to a predetermined value by each of the gas flow rate regulator 216 by the gas flow rate meter 219. There is carried out an operation for testing whether or not the flow rate controlled by the gas flow rate regulator achieves the previously set flow rate so as to adjust the relation between the motion of the gas flow rate regulator and the flow rate as occasion demands so that the regulator can show a precise or desired value, so-called the test of the gas flow rate regulator. In the case that it is determined by the apparatus control portion that the value of the flow rate measured and detected by the gas flow rate meter 219 is deviated from the value of the flow rate to be set by the gas flow rate regulator 216 at a predetermined value or more, it is determined that the gas flow rate regulator 216 is abnormal and a correction is carried out. In the case that the value of the deviation is further larger, it is determined that the corresponding gas flow rate regulator in the gas flow rate regulators 216-1 to 216-12 should be replaced, and a necessity of replacement is displayed on a display apparatus provided in the plasma treatment apparatus and is informed.

In the present embodiment, the valves 217-1 to 217-12 are arranged on the gas lines corresponding to the respective feed paths of the material gases constructing the treating gas and the valves 218-1 to 218-12 are arranged on the gas exhaust lines 215 respectively coupled thereto. The gas necessary for the subject treatment step is introduced to the treatment chamber 220 side by closing the corresponding valve in the valves 218-1 to 218-12 on the gas exhaust line 215 and opening the corresponding valve in the valves 217 on the feed gas line, and the gas (the non-treating gas) which is not necessary to be introduced into the treatment chamber 220 is fed to the gas exhaust line 215 in parallel by closing the valves 217 and opening the valves 218.

Further, the structure is made such that it is possible to detect each of the gas flow rates by using the gas flow rate meter 219 so as to detect the flow rate of the gas flow rate regulator 216 in the case of passing the gas to the gas exhaust line 215. For example, the gas used for the etching treatment in some step during the treatment is introduced to the treatment chamber 220 so as to execute the treatment step and treat the sample, and the gas which is not used for the treatment can be tested by the corresponding gas flow rate regulator 216.

In this case, in the plasma treatment apparatus shown in the present embodiment, as mentioned above, the treatment condition is previously stored in a memory device arranged within the apparatus control portion readably from a general control apparatus such as a host computer or the like regulating a motion of an installed position of a building such as a clean room or the like in which the apparatus is installed, before starting an optional treatment of the sample, and the apparatus control portion can acquire a kind of the gas used for the treatment, values of a composition, a flow rate (a speed) and the like of the gas and a predetermined time of the treatment from the information. Further, a computing apparatus within the apparatus control portion can compute a time necessary for the material gas which is not planed to be used for this treatment to be used next, from the information mentioned above so as to detect. The time information mentioned above is included in the information of the treatment condition and may be acquired by the apparatus control portion.

In the case of executing the test (including treatments with detection or evaluation) of the gas flow rate regulator 216 corresponding to the material gas which is not used in the treatment step during the execution of the treatment, it is desirable to finish the test before being used for the next treatment. Further, since it is necessary that each of the gas flow rate regulators 216 is provided with a predetermined precision over a whole region of the regulated flow rate and speed, a measurement and an error (precision) determination are carried out with respect to a plurality of flow rates and speeds. However, even in the case of carrying out the test under a plurality of different conditions, a time necessary for testing is approximately fixed normally in each of the conditions. Accordingly, a limit is set in the time after starting the test of the regulator of the corresponding gas flow rate regulator 216 until finishing, and the test is forcibly finished in the case that the test is not finished even if the time gets over this limit. In this case, the longest time for the test comes to the limit time. The apparatus control portion calculates a number of the conditions for finishing the test on the safe side until the gas which is not used for the treatment is used in the later treatment, and executes the test of the regulator of the gas flow rate regulator 216 at this number.

Further, the plasma treatment apparatus in accordance with the present embodiment is structured such that it is possible to check out on a control monitor (not shown) provided in the apparatus during the test what gas flow rate regulator is tested, and it is possible to display a result of the test of the gas flow rate regulator. Further, the plasma treatment apparatus is structured such that an operator of the apparatus can input and transmit a command for stopping the test of the gas flow rate regulator 216 in an emergency.

Further, in the present embodiment, it is possible to execute the test of the regulator of the gas flow rate regulator 216 corresponding to the gas in all the time at which the optional material gas is not necessary to be introduced into the treatment chamber 220 in spite of the treatment. For example, the test mentioned above can be executed in parallel even during the cleaning using the plasma in the inner portion of the treatment chamber 220. The plasma cleaning is a work for generating the plasma in the inner portion by introducing the treating gas into the treatment chamber 220 before carrying in the sample W or after carrying the sample W after the treatment, removing the reaction product generated within the treatment chamber 220 going with the treatment or attached to an inner wall surface of the treatment chamber 220 and warming up the temperature of the member surface in the inner portion of the treatment chamber 220. With respect to the gas which is not used for the plasma cleaning, the regulator test of the corresponding gas flow rate regulator 216 is executed in parallel to the execution of the plasma cleaning in the same manner as the case during the treatment step mentioned above.

Modified Embodiment 1

A description will be given of a modified embodiment in which the test of the gas flow rate regulator 216 is particularly executed while the sample W is carried in the treatment chamber 220 or while the treated sample is carried out of the treatment chamber 220 (hereinafter, refer to as "during the carrier of the sample W"), in the plasma treatment apparatus shown in the embodiment 1 mentioned above, with reference to FIG. 3. In the present modified embodiment, since the treatment using the plasma is not executed during the carrier of the sample W, the treating gas is not introduced to the treatment chamber 220 for treating. Accordingly, a predetermined regulator of the gas flow rate regulators 216 is tested during the carrier of the sample W.

In the present modified embodiment and the embodiment mentioned above, the time necessary for carrying the sample is approximately fixed, and the time necessary for executing one condition of the gas flow rate regulator test is approximately fixed as mentioned above, so that the longest time is defined by the limit time. Accordingly, the condition number capable of executing the gas flow rate regulator during the sample carrier is decided, and the gas flow rate regulator of the optional gas can be tested only at the decided number of conditions, per the sample carrier without necessity for checking out the plasma treatment recipe.

Figure 3:
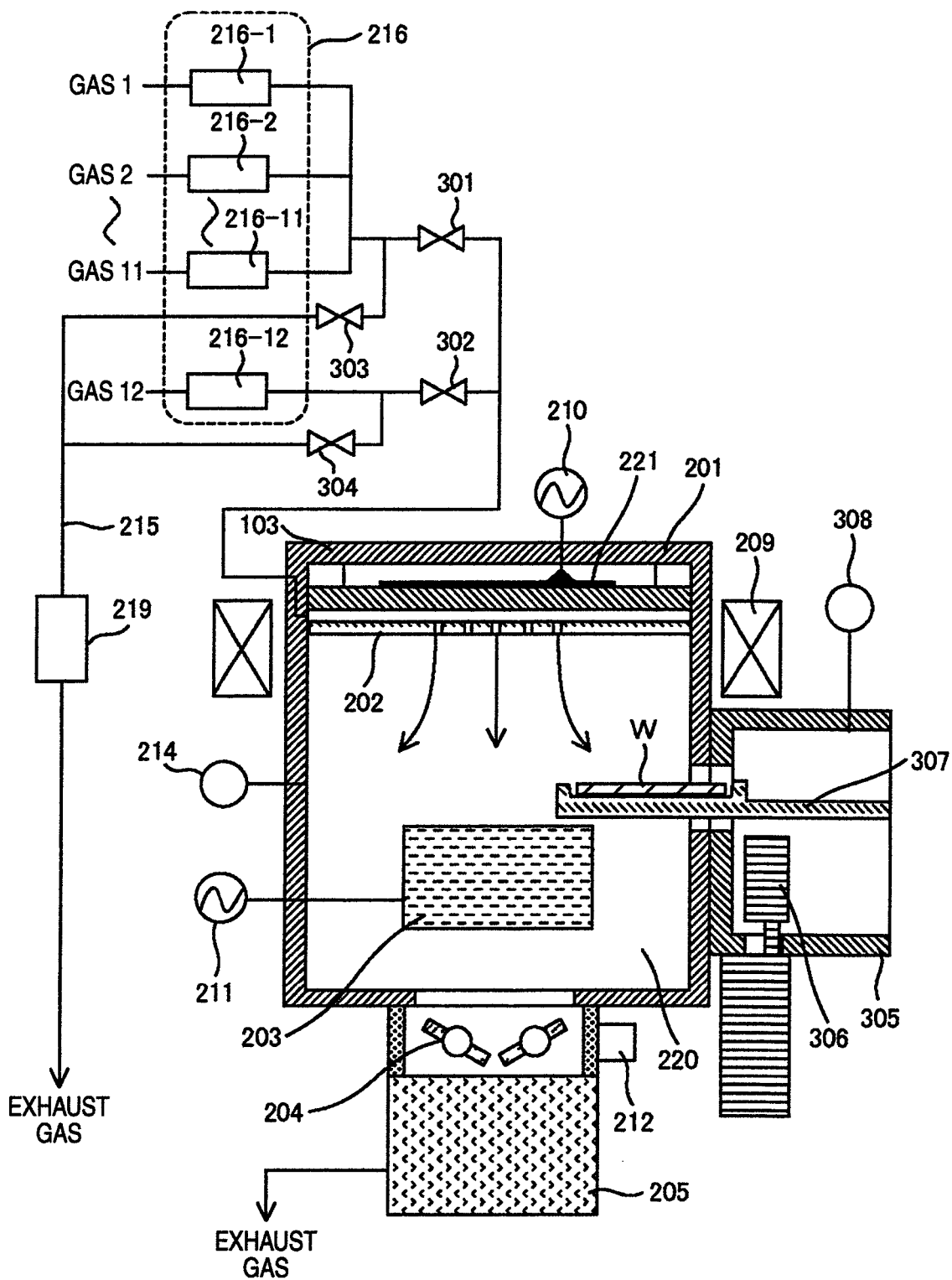
FIG. 3 is a view schematically showing an outline of a structure of a modified embodiment of the embodiment shown in FIGS. 1A and 1B.

FIG. 3 shows a state during the carrier of the sample W in accordance with the present embodiment. The vacuum vessel 201 and a vacuum carrier chamber 305 within the vessel connected to the vacuum vessel 201 and depressurized to an identical pressure to the inner side of the vacuum vessel 201 is connected in an airtight manner by an O-ring (not shown), and the sample W is carried in the inner portion of the treatment chamber 220 or carried out to the outer portion of the treatment chamber 220 through the opening provided between the vacuum vessel 201 and the vacuum carrier chamber 305. Thereafter, the opening mentioned above is closed in an airtight manner by a valve 306 during the treatment, and the inner portion of the treatment chamber 220 is sealed in an airtight manner from the vacuum carrier chamber 305.

In this case, if the pressure in the inner portion of the treatment chamber 220 is higher than the pressure within the vacuum carrier chamber 305 at a time of opening the valve 306 for carrying the sample W, the gas at a time of the treatment by the plasma being left in the inner portion of the treatment chamber 220 flows out into the vacuum carrier chamber 305, is chemically reacted with the sample W during the carrier before or after the treatment and comes to a foreign material or is polluted so as to lower a yield ratio of the treatment. Further, in the case that a pressure difference between the pressure in the inner portion of the treatment chamber 220 and the pressure in the inner portion of the vacuum carrier chamber 305 is higher than a predetermined pressure difference in a moment of opening the valve 306, a small foreign material floating in the inner portion of the treatment chamber 220 or attached to the inner side wall of the treatment chamber by an air stream generated by the pressure difference blows up, and drops on the sample W so as to form the foreign material, whereby there is a case that the yield ratio is lowered.

Accordingly, there is employed a method of introducing the pressure regulating gas within the treatment chamber 220 at a time of carrying the sample into the treatment chamber 220 before opening the valve 306, regulating in such a manner that the pressures in the treatment chamber 220 and the vacuum carrier chamber 305 come to the predetermined pressure difference or lower by using the conductance variable valve 204, and thereafter opening the valve 306. The pressure within the treatment chamber 220 is detected by the vacuum meter 214, and the pressure within the vacuum carrier chamber 305 is detected by the vacuum meter 308. The pressure regulated gas in the treatment chamber 220 at a time of carrying the sample W employs one of the treating gases, and employs particularly an inert gas such as Ar or the like.

During the carrier of the sample W, the Ar is introduced as the pressure regulating gas within the treatment chamber 220 into the treatment chamber 220, and the gas capable of being fed from the other feed paths is stopped being fed. Accordingly, the test of the regulator corresponding to the optional material gas which is not used in the gas flow rate regulators 216-1 to 216-11 is executed in parallel to the carrier of the sample W. In this drawing, the gas 12 as the pressure regulating gas can be used as the component of the treating gas in the same manner as the other gases (the gas 1 to the gas 11) during the treatment of the sample W.

Figure 4A:
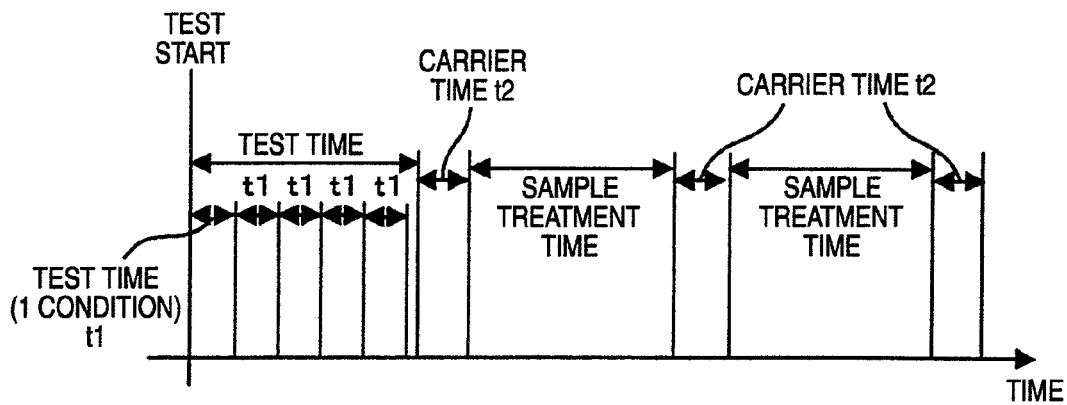
FIGS. 4A, 4B and 4C are charts showing a motion of a treatment going with a change of time carried out in the embodiment and the modified embodiments 1 and 2.
Figure 4B:
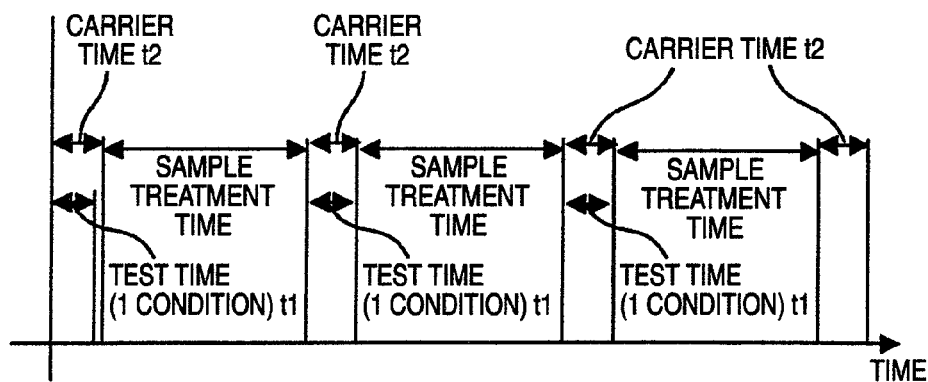
Figure 4C:
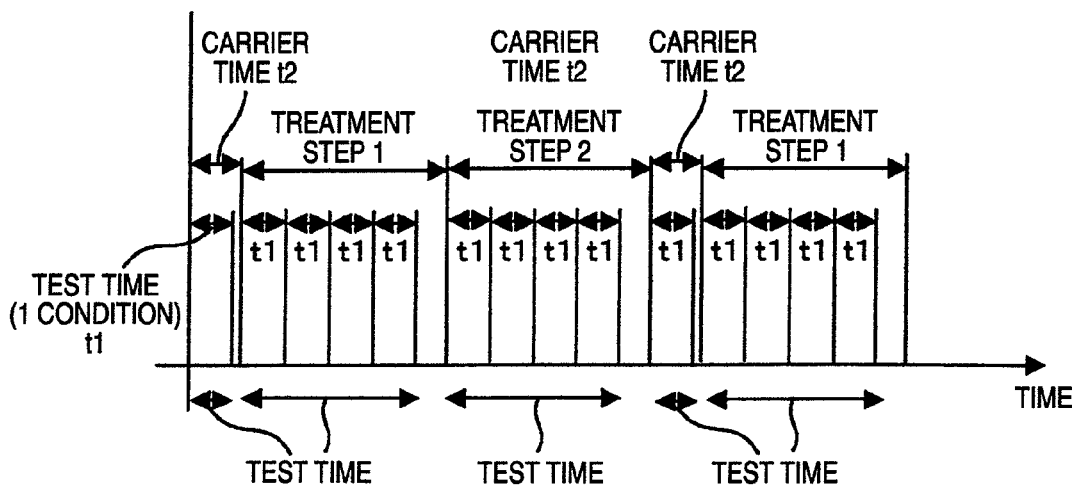

In the case that the time for carrying the sample W is shorter than the time necessary for testing the optional regulator in the gas flow rate regulators 216, the treatment can not be started until the sample is carried in the plasma treatment apparatus or the test is finished after the carrier so as to wait ready, so that a productivity is lowered in comparison with the case that the carrier time of the sample W is longer than the time necessary for the test. In this case, in the case that the present invention is not used, it is necessary to stop the production for periodically executing the gas flow rate regulator test as shown in FIGS. 4A, 4B and 4C. Accordingly, even in the case that the carrier time of the sample W is shorter than the time necessary for testing each of the regulators 216, the productivity is improved as a whole.

Further, in the case that any one of the gas 1 to the gas 11 is the material which can be used for regulating the pressure within the treatment chamber 220, it is possible to execute the test of the gas flow rate regulator 216-12 for regulating the pressure within the treatment chamber 220 at a time of carrying the sample W during the carrier of the sample W in the same manner. Since each of the material gases used for the treating gas of the sample W is used for the treatment at a high degree of vacuum, the gas is normally fed at a small flow rate. However, the material gas fed during the carrier of the sample W is inert so as to be hard to be reacted with the sample W, and is demanded to be at a great flow rate for rapidly moving the particles on the surface of the sample W, the remaining gas of the plasma within the treatment chamber 220, the product material and the like to the lower side of the treatment chamber 220 so as to inhibit an adverse effect to the sample W.

Accordingly, there is a case that the gas for being fed into the treatment chamber 220 during the carrier of the sample W and the gas for being fed as the component of the treatment gas during the treatment are greatly different in the range of the flow rate to be regulated by the regulator of the gas flow regulators 216 although they are identical as the material. In this case, if both the gases are going to be regulated by the same regulator, it is hard to use at the same time because a precision is set high in one side and can not be obtained sufficiently in the other or can not be used.

In the case mentioned above, such as the present embodiment, at least any one of the gas lines corresponding to the gases 1 to 11 may be structured such as to feed the same material gas (for example, Ar) as the gas 12, and the gas line for feeding the gas 12 may be provided with the gas flow rate regulator 216-12 corresponding to the great flow rate and speed. Further, a valve 301 is provided on the feeding gas line in the downstream side of the conflow portion in which the gas lines in the downstream side of the gases 1 to 11 conflow, and a valve 303 is provided on the gas exhaust line 215 coupled between the valve 301 and the conflow portion. Further, the downstream side of the gas line of the gas 12 is coupled to the downstream side of the valve 301 of the gas line in which the gases 1 to 11 conflow, a valve 302 is arranged between the coupling portion and the gas flow rate regulator 216-12, and a valve 304 is arranged on the gas exhaust line 215 coupled between the valve 302 and the gas flow rate regulator 216-12.

At a time of carrying the sample W, the valve 302 is opened, the valve 304 is closed, the Ar gas is introduced into the treatment chamber 220 through the feed gas line, and the sample W is carried in the treatment chamber 220 by a vacuum robot 307 for carrying the sample W or carried out of the treatment chamber 220 in a state in which the pressure in the inner portion is regulated by the Ar gas. During the carrier, the flow rate is detected by using the gas flow rate meter 219 with respect to the regulator corresponding to at least any one gas line of the gases 1 to 11 of the gas flow rate regulators 216-1 to 216-11 by closing the valve 301 and opening the valve 303, and the apparatus control portion compares a predetermined flow rate corresponding to the transmitting command and the value of the actual flow rate, and corrects the command or the relation to the feed electric power value to the regulator of the gas flow rate regulators 216 by using a newly obtained flow rate so as to reset in the case that any one of the both is larger than a predetermined value.

In this case, in the embodiment mentioned above and the present embodiment, each of the gas flow rate regulators 216-1 to 216-12 is provided with the valve capable of opening and closing the flow path in the inner portion, and the corresponding gas line can be opened and closed by a single unit of each of the regulators.

In the case that the material gas which can be used for regulating the pressure within the treatment chamber 220 at a time of carrying the sample W does not exist in the gases from the gas 1 to the gas 11, the gas flow rate regulator 216-12 is tested at the optional time at which the gas 12 is not introduced into the treatment chamber 220 at the other time than the carrier of the sample W as shown in the embodiment mentioned above, or the plasma treatment is stopped at a time of executing the test of the gas flow rate regulator 216-12.

Modified Embodiment 2

Figure 5:
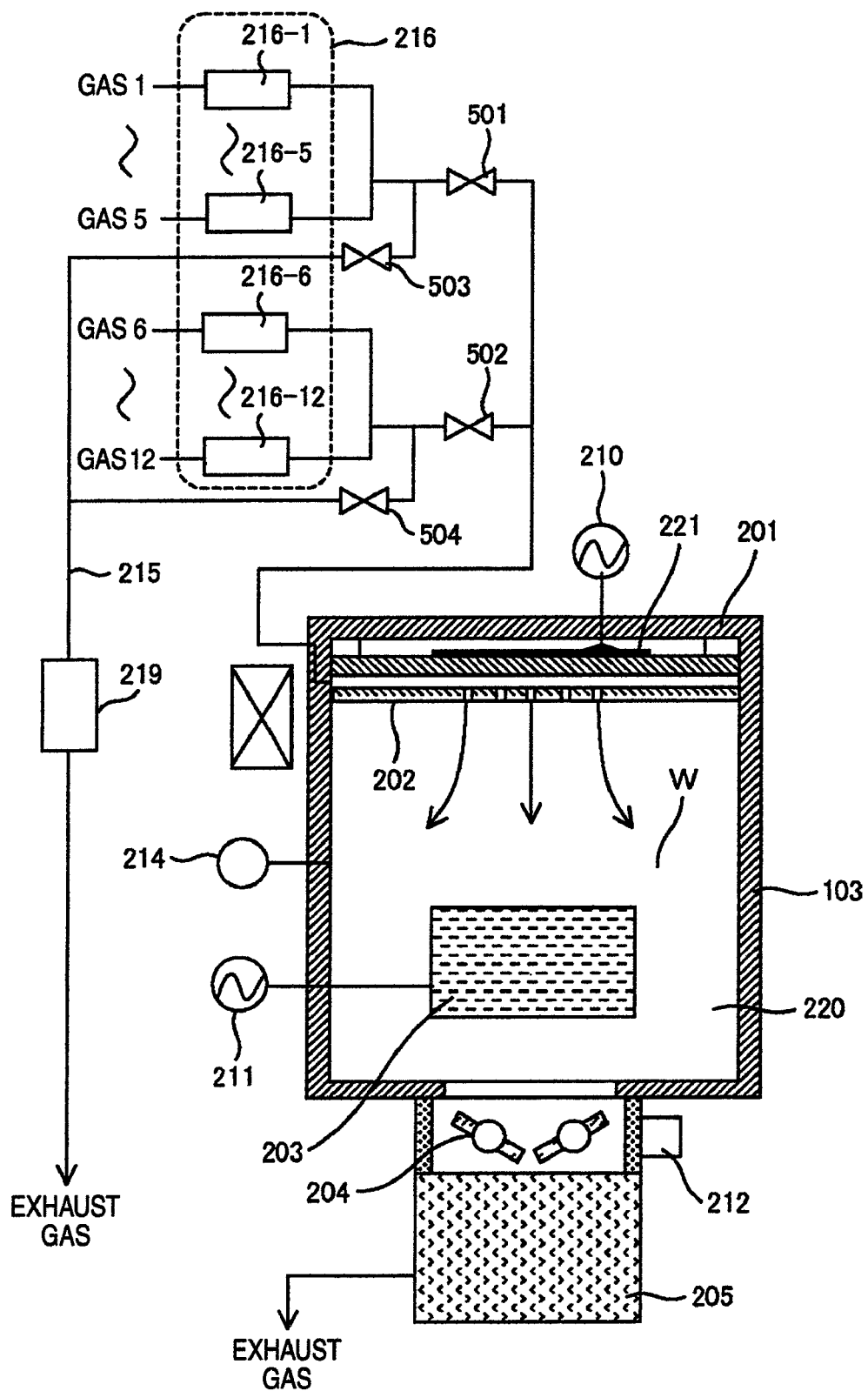
FIG. 5 is a view schematically showing an outline of a structure of the other modified embodiment of the embodiment shown in FIG. 1.

A modified embodiment 2 is shown as an example having a different structure of the gas feed line in FIG. 5. The structure is made such that the gas used for the treatment employs twelve kinds of gases from the gas 1 to the gas 12. The gas lines from the gas 1 to the gas 5 respectively conflow in the downstream of the gas flow rate regulator 216-1 to the gas flow rate regulator 216-5 so as to form one gas line piping. Further, the gas lines of the gas 6 to the gas 12 respectively conflow in the downstream side of the gas flow rate regulators 216-6 to 216-12 into one gas line.

In the present embodiment 2, the gas 1 to the gas 12 are divided into a plurality of (two) gas line groups, the gas lines are brought together in each of the groups, and the gas exhaust line 215 is coupled to each of them. The gas lines brought together into one in the respective groups are further brought together into one so as to be introduced as one treating gas into the treatment chamber 220.

At this time, the optional gas from the gas 1 to the gas 5 is introduced into the treatment chamber 220 in a state of opening a valve 501 and closing a valve 503. Further, at a time of executing the test of each of the regulators of the gas flow rate regulators 216 from the gas 1 to the gas 5, the valve 501 is closed, and the valve 503 is opened so as to detect the actual flow rate by using the gas flow rate regulator 219 on the coupled gas exhaust line 215 and execute the test by using the actual flow rate. With respect to the gas 6 to the gas 12, the optional gas can be introduced into the treatment chamber 220 in the same manner as the gas 1 to the gas 5, or the test of each of the regulators of the gas flow rate regulators 216 can be executed.

During the prosecution of the treatment of the sample W while introducing at least any one gas from the gas 1 to the gas 5 belonging to the one group into the treatment chamber 220, the test of the regulator of the gas flow rate regulator 216 in any one gas line from the gas 6 to the gas 12 in the other group is executed in parallel. The same matter is applied to the inverse case. These groups may be divided into groups, for example, on the basis of an attribute comprising a plurality of material gases used for one step of the treatment. In other words, since each of the gas lines belonging to the group of the gas used for the other step is not used during the prosecution of the one step of the treatment, the structure is made such that the test of each of the regulators of the gas flow regulator 216 of the gas lines in accordance with the other group is executed during the prosecution of the step of the treatment in accordance with the one group.

FIGS. 4A, 4B and 4C are charts showing a motion of the treatment going with the change of the time carried out in the embodiment and the modified embodiments 1 and 2. FIG. 4A is a chart in the case that each of the treatments of the sample is carried out after executing the test of the gas flow rate regulator 216. In this case, there is shown an example that the test of the gas flow rate regulator 216 is carried out about five motion conditions. FIG. 4B is a chart showing a flow of a motion in the case that the test of the gas flow rate regulator 216 is executed during the carrier of the sample W. There is shown a case that a time t1 necessary for testing the respective conditions in the test of the optional gas flow rate regulator 216 or measuring the flow rate (the speed) is shorter than a time t2 necessary for carrying the sample W. In the present embodiment, the test of each of the conditions is carried out during each of five carriers of each of the samples W.

FIG. 4C is a chart showing a flow of a motion in the case that the treatment of one sample is constituted, for example, by two treatment steps, and the test of the regulator of the gas flow rate regulator 216 of the feeding gas line corresponding to the other material gases than the material gas used in each of the steps is carried out in parallel while executing the treatment of the step. In the present embodiment, the test of the optional condition is carried out in the same manner as the case of FIG. 4B even during the carrier of the sample W, and the test of a plurality of conditions is executed during the treatment in each of the steps. Further, during the time of each of the steps, the apparatus control portion regulating the motion of the gas flow rate meter 219 forecasts a finishing time of the treatment, a time necessary for the test and a test finishing time, and in the case that the apparatus control portion determines that the time for the next condition test is shorter than the time till the end of the treatment in the step, at a time when the optional condition test is finished, it stops the test and continues the treatment of the sample. Accordingly, it is possible to inhibit the wait time until the treatment in the next step is started after the treatment of the sample is finished form being generated.

In the plasma treatment apparatus shown in the embodiments 1 to 3, the gas flow rate meter 219 is arranged in the downstream side of the gas flow rate regulator in the present embodiment, however, may be arranged in the upstream side of the gas flow rate regulator in some kind of the gas flow rate regulator. Further, in the case of using a gas flow rate regulator with a self flow rate diagnosing function, it is possible to execute its own test on the basis of the motion of the inner portion of the gas flow rate regulator while exhausting the gas during the test to the gas exhaust line 215 without arranging the gas flow rate meter.

In accordance with the embodiment and the modified embodiment mentioned above, the test of the gas flow rate regulator 216 is executed in parallel to the treatment or the carrier. Accordingly, the gas lines feeding a plurality of material gases constituting the treating gas are exclusively coupled to the gas exhaust line 215 corresponding to the testing gas line, and the actual flow rate of the gas flow rate regulator corresponding to the specific gas is detected by the gas flow rate meter 219 on the gas exhaust line 215. The specific gas may be selected by the command from the apparatus control portion, or may be selected by the command input from the control monitor by the user.

As the tested gas line or the corresponding material gas, the gas which is not used in the motion of the apparatus carried out in parallel to the test is selected. For example, in the regulator of the gas flow rate regulator 216 on the gas line corresponding to at least any one of the other material gases than the Ar gas introduced into the treatment chamber 220 during the carrier of the sample W for regulating the pressure, in the material gases constituting the treating gas, the test is carried during the carrier of the sample W. Alternatively, in the case that the treatment of the sample W is constituted by a plurality of steps, the test of the regulator of the gas flow rate regulator 216 on the other material gas lines than the material gas line used for the optional one step is carried out during the step of the treatment.

As mentioned above, it is possible to reduce a standby time of the apparatus so as to improve an efficiency of the motion of the apparatus and an efficiency of the treatment by selecting the gas of the kind which is not used in each of the motions of the plasma treatment apparatus such as the treatment or the carrier of the sample W, and carrying out the test of the gas flow rate regulator on the gas line for feeding the gas in parallel to the motion.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A method of operating a plasma treatment apparatus which processes a sample of a semiconductor wafer within a treatment chamber arranged within a vacuum vessel, the plasma treatment apparatus comprising a plurality of feeding gas lines through which a plurality of gases respectively pass, a plurality of gas flow rate regulators respectively disposed on the plurality of feeding gas lines, a testing gas flow path coupled to the plurality of feeding gas lines, the testing gas flow path being coupled to the plurality of feeding gas lines which is arranged outside of the treatment chamber and a flow rate tester which is disposed on the testing gas flow path and tests a gas flow rate from at least one of the gas flow rate regulators, the method of operating the plasma treatment apparatus comprising the steps of:

arranging the sample to be treated within the treatment chamber which is depressurized;

communicating the plurality of feeding gas lines to an inner side of the treatment chamber;

feeding at least one of the gases which is fed through a corresponding feeding gas line of the plurality of feeding gas lines, the at least one of the gases being regulated by the gas flow rate regulator disposed on the corresponding feeding gas line;

treating the sample arranged within the treatment chamber by a plasma generated therein by using the at least one of the gases; and testing the gas flow rate on the testing gas flow path by the flow rate tester during the step of treating the sample within the treatment chamber, the testing gas flow path being communicated to one of the plurality of gas feeding lines corresponding to a gas which is not used for the step of treating the sample.

2. A method of operating a plasma treatment apparatus as claimed in claim 1, wherein the plurality of feeding gas lines are divided into a plurality of groups, and the step of testing the gas flow rate on the testing gas flow path for the gas in one group, of the plurality of groups, is carried out in parallel to the step of feeding the gas of another group, of the plurality of groups, to the treatment chamber.

3. A method of operating a plasma treatment apparatus as claimed in claim 1, wherein the step of testing the gas flow rate on the testing gas flow path is carried out by the flow rate tester which is coupled to the gas line of an exclusively selected gas, of the plurality of gases, which is not used for the step of treating the sample.

4. A method of operating a plasma treatment apparatus which processes a sample of a semiconductor wafer within a treatment chamber arranged within a vacuum vessel, the plasma treatment apparatus comprising a vacuum carrier chamber coupled to the treatment chamber in the vacuum vessel, a plurality of feeding gas lines through which a plurality of gases respectively pass, a plurality of gas flow rate regulators respectively disposed on the plurality of feeding gas lines, a testing gas flow path coupled to the plurality of feeding gas lines which is arranged outside of the treatment chamber, and a flow rate tester which is disposed on the testing gas flow path and tests gas flow rate from at least one of the gas flow rate regulators, the method of operating the plasma treatment apparatus comprising the steps of:

arranging the sample to be treated within a treatment chamber which is depressurized;

communicating the plurality of feeding gas lines to an inner side of the treatment chamber;

feeding at least one of the gases which is fed through a corresponding feeding gas line of the plurality of feeding gas lines, the at least one of the gases being regulated by the gas flow rate regulator disposed on the corresponding feeding gas line; and treating the sample arranged within the treatment chamber by a plasma generated therein by using the at least one of the gases;

the method further comprising the steps of:

carrying the sample in an inner portion of the vacuum carrier chamber which is communicated with the inner side of the treatment chamber in the inner portion; and testing the gas flow rate on the testing gas flow path by the flow rate tester during the step of carrying the sample in the inner portion of the vacuum carrier chamber, the testing gas flow path being communicated to one of the plurality of feeding gas lines corresponding to a gas which is not used in the step of carrying the sample.

5. A method of operating a plasma treatment apparatus as claimed in claim 4, wherein the step of testing the gas flow rate on the testing gas flow path is carried out by the flow rate tester which is coupled to the gas line of an exclusively selected gas, of the plurality of gases, not used in the step of carrying the sample in the inner portion of the vacuum carrying chamber.

* * * * *